(12) United States Patent
Hayakawa et al.

(10) Patent No.: US 6,426,517 B2
(45) Date of Patent: Jul. 30, 2002

(54) ACTIVE MATRIX DISPLAY DEVICE HAVING MULTIPLE GATE ELECTRODE PORTIONS

(75) Inventors: Masahiko Hayakawa; Yosuke Tsukamoto, both of Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/736,139

(22) Filed: Dec. 13, 2000

Related U.S. Application Data

(63) Continuation of application No. 08/970,542, filed on Nov. 14, 1997, now Pat. No. 6,184,559.

(30) Foreign Application Priority Data

Nov. 21, 1996 (JP) .............................................. 8-326069

(51) Int. Cl.[7] .......................... H01L 29/04; H01L 29/76; H01L 27/01
(52) U.S. Cl. ........................... 257/72; 257/66; 257/352; 257/401
(58) Field of Search ............................ 257/401, 57, 59, 257/66, 72, 365, 347, 352, 903

(56) References Cited

U.S. PATENT DOCUMENTS

| | | | | |
|---|---|---|---|---|
| 5,272,369 A | * | 12/1993 | Colinge et al. ............. 257/352 |
| 5,331,192 A | * | 7/1994 | Kudoh ........................ 257/401 |
| 5,528,056 A | * | 6/1996 | Shimada et al. ............... 257/72 |
| 5,569,936 A | | 10/1996 | Zhang et al. .................. 257/66 |
| 5,751,033 A | * | 5/1998 | Miya ........................... 257/401 |
| 5,777,360 A | * | 7/1998 | Rostoker et al. ............ 257/401 |
| 5,812,231 A | * | 9/1998 | Kochi et al. ................... 257/72 |
| 5,821,564 A | * | 10/1998 | Wu et al. ..................... 257/903 |
| 5,929,464 A | * | 7/1999 | Yamazaki et al. ............. 257/72 |
| 6,104,067 A | | 8/2000 | Zhang et al. ................ 257/365 |
| 6,184,559 B1 | * | 2/2001 | Hayakawa et al. .......... 257/401 |

FOREIGN PATENT DOCUMENTS

JP 58-171860 10/1983 .................. 257/347

* cited by examiner

Primary Examiner—Steven Loke
(74) Attorney, Agent, or Firm—Fish & Richardson P.C.

(57) ABSTRACT

In a thin-film transistor of multi-gate structure, the width of a channel forming region 108 closest to a drain region 102 is made the narrowest. This prevents a transistor structure closest to the drain region from first deteriorating. Further, the channel length at the vicinity of a center of an active layer is intentionally widened, so that the amount of current flowing through the vicinity of the center of the active layer is decreased and the deteriorating phenomenon due to heat accumulation is prevented. Therefore, a semiconductor device with a high reliability is realized.

14 Claims, 4 Drawing Sheets

ACTIVE MATRIX DISPLAY DEVICE HAVING MULTIPLE GATE ELECTRODE PORTIONS

This is a continuation of U.S. application Ser. No. 08/970,542, filed Nov. 14, 1997, now U.S. Pat. No. 6,184,559.

BACKGROUND OF THE INVENTION

1. Field of the Invention

The present invention relates to a semiconductor device using a thin-film semiconductor. More particularly, the present invention relates to a structure of a gate electrode in an insulated gate type transistor.

2. Description of the Related Art

As a semiconductor device using a thin-film semiconductor, attention is attached to a thin-film transistor (TFT). Especially, in recent years, a TFT capable of performing high speed operation by using a crystalline silicon film (for example, polysilicon film), has been put into a practical use.

Although a thin-film transistor using a crystalline silicon film as an active layer has a high mobility (field effect mobility), it has such a defect that an off-state current (current flowing when the TFT is in an off-state) is large. Further, the thin-film transistor has a problem that when the mobility becomes high, a withstand voltage becomes low so that deterioration becomes noticeable.

As means for solving such problems, there is known a technique disclosed in Japanese Examined Patent Publication No. Hei 5-44195. According to this technique, a thin-film transistor is made equivalently to have such a structure (also called as a multi-gate structure) that a plurality of thin-film transistors are connected in series to each other, so that an applied voltage is distributed to each of the plurality of thin-film transistors.

FIG. 4 is a structural view showing an active layer and a gate electrode of a thin-film transistor manufactured by using the technique disclosed in the above publication. In FIG. 4, reference numeral 401 denotes a source region, and 402 denotes a drain region. Gate electrodes 403 to 406 are formed above the active layer through a gate insulating film (not shown). At this time, the gate electrodes 403 to 406 are formed integrally so that they are connected electrically.

Channel forming regions 407 to 410 are formed just under the gate electrodes 403 to 406 into shapes corresponding to those of the gate electrodes 403 to 406. It is characterized in that the structure is substantially composed of a plurality of thin-film transistors commonly connected in series.

However, according to experiments carried out by the present inventors by using the TFTs having the structure as shown in FIG. 4, it has been found that the thin-film transistor closest to the drain region 402 deteriorates most intensely. Also, it has been found that when a high voltage is applied between the source and drain, breakdown or deterioration proceeds sequentially from a transistor at the side close to the drain region.

According to another experiment, it has been found that in a TFT constituted by an active layer with a wide channel width, the vicinity of a center of an active layer (vicinity of the center in the channel width direction) deteriorates most intensely.

SUMMARY OF THE INVENTION

An object of the present invention is to prevent breakdown or deterioration of a semiconductor device equivalently having such a structure that a plurality of semiconductor devices are connected in series to each other, by relieving the concentration of electric field on one of the plurality of semiconductor devices close to a drain side.

Another object of the present invention is to prevent deterioration from occurring at a center portion of an active layer, by suppressing an electric current flowing through the vicinity of the center of the active layer.

According to a structure of a first invention, a semiconductor device is comprised of: an active layer including source and drain regions and channel forming regions; a gate insulating film and a gate electrode overlapping with the active layer through the gate insulating film, and is characterized in that the gate electrode has a structure which can be regarded substantially as a plurality of gate electrodes integrally formed, and that among said plurality of gate electrodes, the one closest to the drain region has the narrowest width.

In the above structure, the fact that the width of the gate electrode closest to the drain region is the narrowest implies the fact that the width of the channel forming region (in other words, channel length) formed just under the gate electrode is the narrowest.

According to another structure of the first invention, a semiconductor device is comprised of: an active layer including source and drain regions and channel forming regions; a gate insulating film; and a gate electrode overlapping with the active layer through the gate insulating film, and is characterized in that the gate electrode has a structure which can be regarded substantially as a plurality of gate electrodes integrally formed, and that the widths of the plurality of gate electrodes sequentially become narrower as it comes to close to the drain region.

Also in this case, the above feature implies that the widths of the channel forming regions sequentially become narrower as it comes close to the drain region.

These structures are intended to decrease the resistance component of the channel forming region by narrowing the width of the gate electrode close to the drain region, that is, the width of the channel forming region, so that a voltage applied to the channel forming region is lowered.

According to a structure of a second invention, a semiconductor device is comprised of: an active layer including source and drain regions and channel forming regions; a gate insulating film; and a gate electrode overlapping with said active layer through said gate insulating film, and is characterized in that a width of the gate electrode is varied in a channel width direction of the active layer.

According to another structure of the second invention, a semiconductor device is comprised of: an active layer including source and drain regions and channel forming regions; a gate insulating film; and a gate electrode overlapping with said active layer through said gate insulating film, and is characterized in that a width of the gate electrode becomes wider as it comes close to a center portion of the active layer from an end of the active layer in a channel width direction.

The above two structures are intended to suppress the amount of flowing current by widening the width of the gate electrode at the vicinity of the center of the active layer so that the channel forming region is widened and the resistance component is increased at the vicinity of the center of the active layer.

As described above, the gist of the present invention is to intentionally change the width of the channel forming region in the active layer, so that the resistance component of the channel forming region is set to have a desired characteristic. That is, the present invention is a technique to distribute a voltage applied to the channel forming region and to control the amount of current flowing through a specified portion of the channel forming region.

DETAILED DESCRIPTION OF THE PREFERRED EMBODIMENTS

Figure 1:
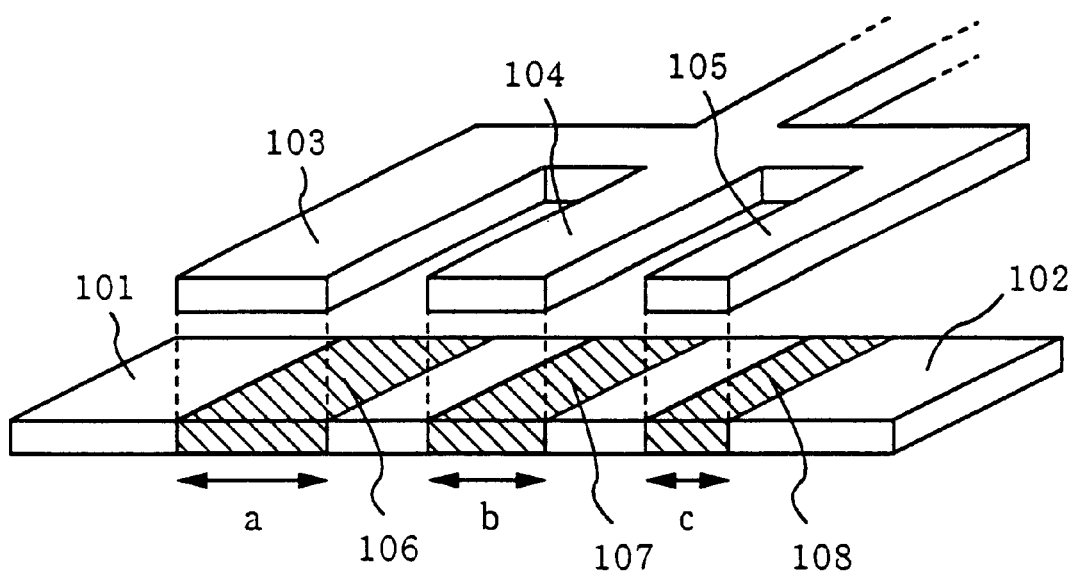
FIG. 1 is a view for explaining the structure of an active layer and a gate electrode of Embodiment 1.

A first invention is a technique to prevent an electric field from concentrating onto a channel forming region close to a drain region in a thin-film transistor having a multi-gate structure. In order to realize the technique, the structure as shown in FIG. 1 is adopted.

In an active layer, channel forming regions 106 to 108 are formed into the shapes corresponding to that of gate electrodes. Since gate widths become narrow in the sequence of the gate electrodes 103, 104 and 105, channel lengths become shorter in the sequence of the channel forming regions 106, 107 and 108 (the channel forming region 108 is the shortest).

With this structure, in accordance with Ohm's law, a voltage applied to the channel forming region 108 becomes the lowest, so that an electric field formed concentrically in an end portion at a drain side of the channel forming region 108 becomes low. As a result, it is possible to relieve the phenomenon that an electric field is more concentrated onto a portion as it comes close to a drain region.

A second invention is a technique to prevent deterioration or breakdown from proceeding first in the vicinity of a center of an active layer. In order to realize the technique, the structure as shown in FIG. 5 is adopted.

Figure 5:
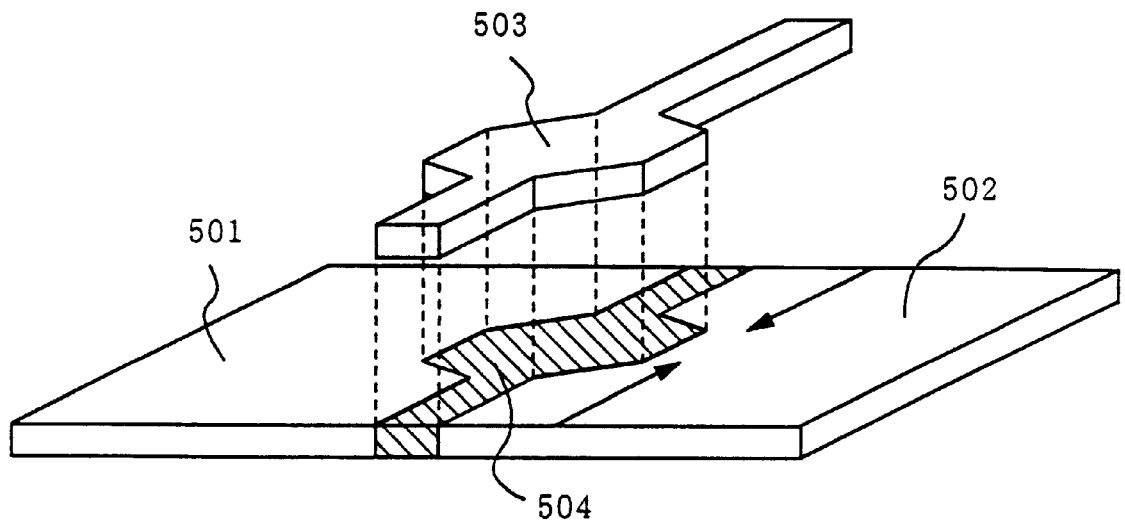
FIG. 5 is a view for explaining the structure of an active layer and a gate electrode of Embodiment 4.

In FIG. 5, a gate electrode 503 is patterned into such a shape that the width of the gate electrode in the vicinity of the center of the active layer becomes the widest. As a result, a channel length of a channel forming region 504 becomes the widest in the vicinity of the center of the active layer.

With the above structure, the amount of current flowing through the vicinity of the active layer can be suppressed so that the amount of generated heat can be decreased. Accordingly, it is possible to prevent the deterioration phenomenon which appears to be caused by heat accumulation.

Embodiment 1

In this embodiment, a thin-film transistor will be exemplified as a semiconductor device, and the structures of an active layer and a gate electrode of a thin-film transistor using the first invention will be described. In this embodiment, although a gate electrode has a triple-gate type multi-gate electrode structure in which a gate electrode is divided into three at a region where the gate electrode overlaps with an active layer, the gate electrode is not limited to this structure.

In FIG. 1, reference numeral 101 denotes a source region, and 102 denotes a drain region, which are formed by adding impurity elements (phosphorus, boron, etc.) imparting one conductivity. Also, reference numeral 103 denotes a gate electrode with a width "a", 104 denotes a gate electrode with a width "b", and 105 denotes a gate electrode with a width "c". As shown in FIG. 1, the gate electrodes 103 to 105 are electrically connected to each other.

Further her, regions 106 to 108 are channel forming regions formed correspondingly to the gate electrodes 103 to 105, and are substantially intrinsic regions (undoped region) where impurity elements are not intentionally added.

The structure of the first invention is featured that the widths of the gate electrodes (widths of the channel forming regions) become narrower as it comes close to the drain region 102. In FIG. 1, the widths of the gate electrodes become narrower in the sequence of "a", "b" and "c".

Incidentally, the scope of the first invention is not limited to the shape of the active layer and the gate electrodes shown in FIG. 1, but a user may arbitrarily determine the shape. Also, it is necessary for a user to experimentally obtain specific values of the widths of the channel forming regions and the like.

Further, in this embodiment, the description is made of the structure in which the widths of the gate electrodes sequentially become narrower as it comes close to the drain region. However, the same effect as in the first invention can be obtained even if only the gate electrode closest to the drain region is made thinner than all of the other gate electrodes and all of the other gate electrodes are made to have the same width.

Now, the description is made of the process until the present inventors reached the first invention. Since a channel forming region is substantially intrinsic, it behaves as a region having high resistance. Thus, even if a thin-film transistor is in an on-state, it is conceivable that as a channel length becomes longer, its resistance component becomes higher. That is, in the structure shown in FIG. 1, it is conceivable that the resistance of the channel forming region 108 is the lowest.

Then, if the amount of current flowing between a source and a drain is constant, according to Ohm's law, the higher the resistance of a region is, the larger a voltage applied to the region is. That is, a voltage applied to the channel forming region 108 becomes the lowest.

Further, it is conceivable that a voltage applied to both ends of a channel forming region is concentrically applied to the end portion (channel/drain connection portion) close to the drain side of the channel forming region so that a high electric field is formed. Thus, it can be said that as the voltage applied to the channel forming region becomes lower, the electric field concentrated on the end portion at the drain side become lower.

When the above consideration is summarized, in the structure shown in FIG. 1, it is understood that the electric fields formed in the end portions at the drain side become lower in the sequence of the channel forming regions 106, 107 and 108.

Conventionally, a higher electric field is apt to be formed at the channel/drain connection portion closer to the drain region, so that deterioration or breakdown tends to occur. However, by effecting the first invention, the electric field applied to the channel/drain connection portion can be made low as it comes close to the drain region, so that the deterioration can be relieved.

Embodiment 2

In this embodiment, an example in which the shape of an active layer is different from that of the first embodiment, will be described with reference to FIG. 2. Portions in FIG. 2 corresponding to those in FIG. 1 will be designated by the same reference numerals.

Figure 2:
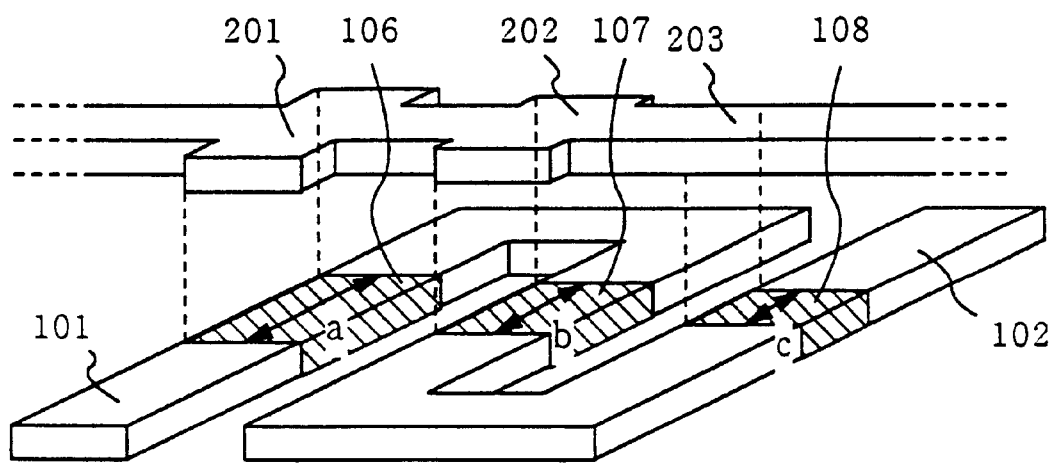
FIG. 2 is a view for explaining the structure of an active layer and a gate electrode of Embodiment 2.

In the structure shown in FIG. 2, a first difference from FIG. 1 is that the active layer has a zigzag or serpentine shape. Such a shape is effective in lowering an area occupied by the active layer. A second difference from FIG. 1 is the shape of a gate electrode.

By adjusting the design pattern of the gate electrode, a channel forming region with a desired width can be formed. In this embodiment, in order to form a channel forming region 106 with a channel length "a", a gate electrode portion indicated by reference numeral 201 is formed. Also, in order to form a channel forming region 107 with a channel length "b" and a channel forming region 108 with a channel length "c", gate electrode portions 202 and 203 are formed, respectively.

Of course, the shape of the active layer and the shape of the gate electrode to which the first invention can be applied, are not limited to those shown in this embodiment. It is needless to say that a user may adequately determine the shape according to the necessity.

By employing the gate electrode described above, it is possible to form the active layer in which the widths of the channel forming regions become narrower as it comes close to the drain region 102 (a>b>c in the drawing).

Embodiment 3

The structure shown in the first or second embodiment is effective when the positions of a source region and a drain region are fixed. For example, the source and drain regions are fixed when a driving circuit of an active matrix type electro-optical device is formed.

However, since pixel TFTs arranged in a pixel matrix circuit of the active matrix type electro-optical device, repeat charge and discharge of an electric charge, the source region and the drain region are counterchanged with each other every time the charge and discharge are made. In this case, the first invention can not be effected by the structures described in the first and second embodiments.

Figure 3:
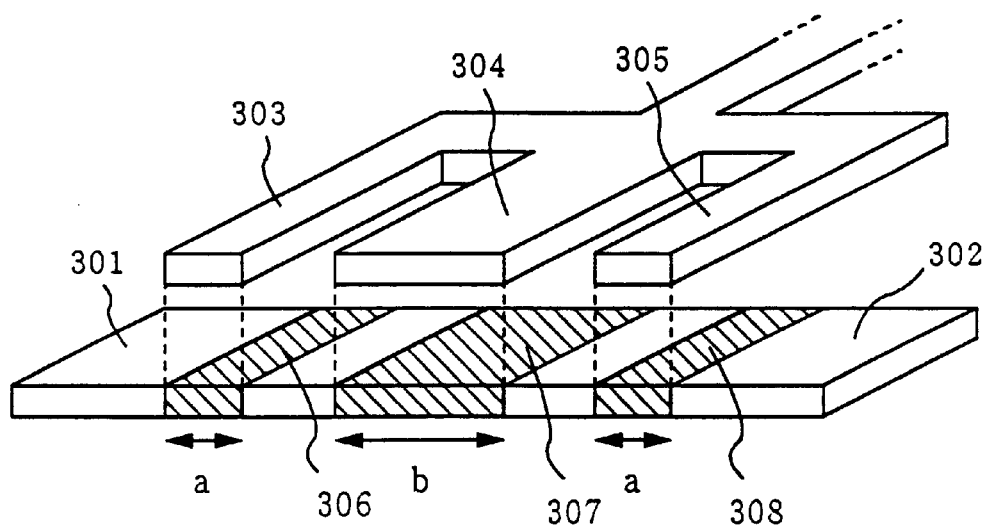
FIG. 3 is a view for explaining the structure of an active layer and a gate electrode of Embodiment 3.
Figure 4:
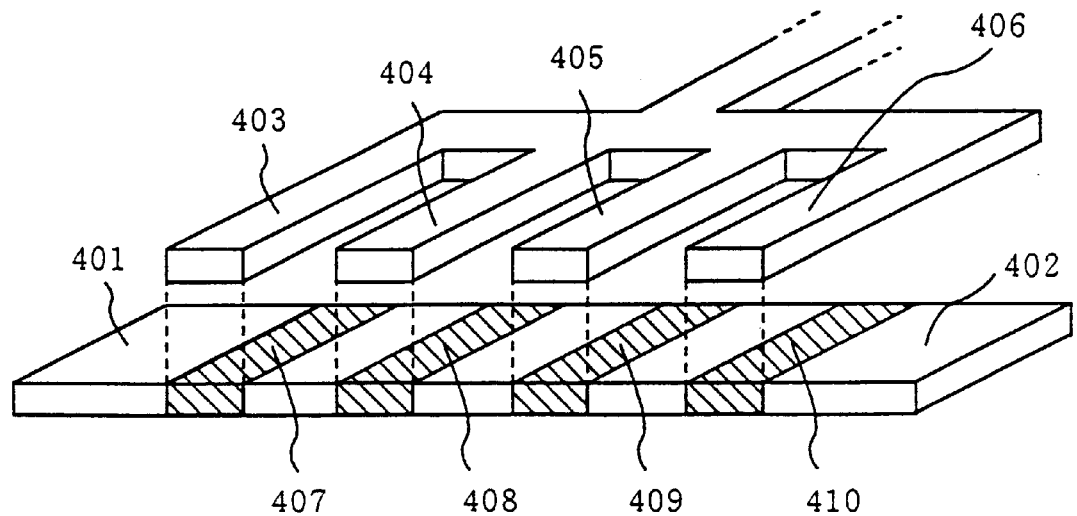
FIG. 4 is a view for explaining the structure of an active layer and a gate electrode of the prior art.

Therefore, in the case described above, as shown in FIG. 3, it is necessary to form a structure in which gate electrodes 303 and 305 at the sides close to a source region (or drain region) 301 and a drain region (or source region) 302, respectively, are made narrower than a gate electrode 304.

In this embodiment, when a channel length of a channel forming region 307 is "b", channel lengths of channel forming regions 306 and 307 are made a channel length "a" which is shorter than the channel length "b". If the gate electrodes are made to have a symmetrical structure between a source side and a drain side, it is desirable for keeping the symmetry of a TFT operation.

Embodiment 4

In this embodiment, a structure of an active layer and a gate electrode of a thin-film transistor using a second invention will be described with reference to FIG. 5.

In FIG. 5, reference numeral 501 denotes a source region, 502 denotes a drain region, and 503 denotes a gate electrode. The gate electrode 503 has a structure in which a width of electrode is locally widened. As a result, the width of a channel forming region 504 which is formed in correspondence with the shape of the gate electrode 503 becomes wider as it comes close to the center of an active layer from end portions of the active layer in a channel width direction (direction shown by arrows in the drawing).

Here the description is made of the process until the present inventors found the second invention. The present inventors considered the phenomenon that deterioration started from the vicinity of a center of an active layer in a thin-film transistor using the active layer having a wide channel width, and assumed that the phenomenon was greatly affected by heat accumulation which was caused by difficulty of heat radiation from the vicinity of the center of the active layer.

For that reason, it is necessary to decrease the amount of current flowing through the vicinity of the center of the active layer to suppress heat generation. Therefore, the inventors considered it to be important that the channel length at the vicinity of the center of the active layer should be elongated to form a region having a large resistance component to suppress the amount of current flowing therethrough.

This embodiment shows a technique invented based on the above findings of the present inventors, and shows an example in which the shape of the gate electrode 503 above the active layer is locally changed (widened), so that a large current is prevented from flowing through the vicinity of the center of the active layer.

Incidentally, as described above, the gist of the second invention is that the channel length close to the center of the active layer is elongated so as to suppress the heat generation due to a large electric current. Therefore, if the gist is kept, the structure and shape of the gate electrode may be arbitrarily designed according to the necessity of a user.

Embodiment 5

In this embodiment, an example in which the second invention shown in the fourth embodiment is combined with a heat dissipation effect due to the shape of an active layer, will be described with reference to FIG. 6.

Figure 6:
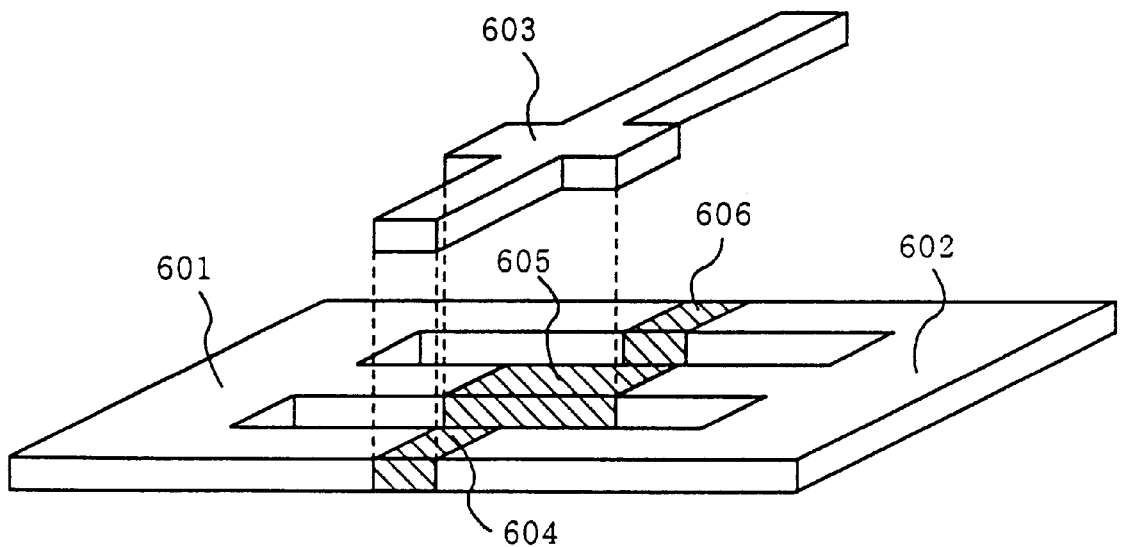
FIG. 6 is a view for explaining the structure of an active layer and a gate electrode of Embodiment 5.

The feature of an active layer shown in FIG. 6 is that slits are locally provided. That is, parts of the active layer are hollowed out, so that three active layers with narrow channel widths are substantially electrically connected in parallel to each other. The number of the slits may be appropriately changed.

In FIG. 6, reference numeral 601 denotes a source region, 602 denotes a drain region 603 denotes a gate electrode, and 604 to 606 denote channel forming regions formed just under the gate electrode 603. The channel forming regions 604 and 606 have channel lengths of the same width, and the channel forming region 605 has a channel length longer than other regions.

The feature of this embodiment is that since the slits are provided in the active layer, generated heat can be easily dissipated. Thus, the amount of flowing current can be decreased by the second invention so that the generation of intense heat is suppressed, and heat dissipation can be further effectively carried out by providing the slits.

Embodiment 6

By combining the first invention described in the first to third embodiments with the second invention described in the fourth and fifth embodiments, a thin-film transistor of multi-gate structure having higher reliability can be manufactured.

That is, deterioration of a thin-film transistor close to a drain region can be prevented by the first invention, and deterioration from the vicinity of a center of an active layer due to heat generation can be prevented by the second invention.

This embodiment is an especially useful technique for a thin-film transistor and the like for a driving circuit which handles a large current and brings high speed operation.

Embodiment 7

A thin-film transistor described in the first to sixth embodiments can constitute an active matrix type electro-optical device (liquid crystal display device, EL display device, EC display device, and the like). For example, in a liquid crystal display device in which a pixel matrix circuit and a driving circuit are integrally formed on the same substrate, the first invention is effective for the pixel matrix circuit to which a high voltage is applied, and the second invention is effective for the driving circuit which handles a large current.

U.S. Pat. No. 5,569,936, the disclosure of which is herein incorporated by reference, discloses an active matrix type liquid crystal display device, which the thin film transistor formed through the first to sixth embodiments of the present invention can be applied to.

A thin-film transistor using the present invention can be applied to electronic instruments and the like in which the above electro-optical device is used as a display medium. The electronic instruments will be described below with reference to drawings.

As semiconductor devices using the present invention, there are enumerated a TV camera, a head mount display, a car navigation system, a projector, a video camera, a personal computer, and the like. Brief description thereof will be presented with reference to FIGS. 7A to 7F.

Figure 7A:
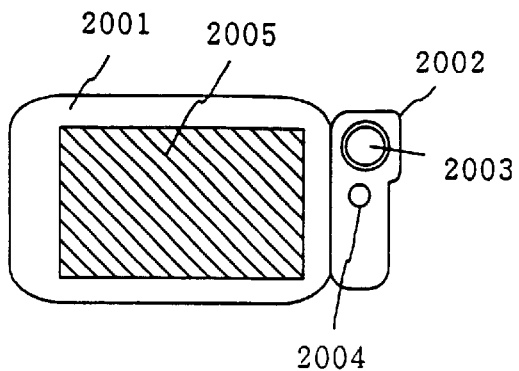
FIGS. 7A to 7F are views for explaining examples of electronic instruments of Embodiment 7.

FIG. 7A shows a mobile computer which is constituted by a main body 2001, a camera portion 2002, an image receiving portion 2003, an operation switch 2004, and a display device 2005. The present invention can be applied to the display device 2005 and an integrated circuit incorporated into the device.

Figure 7B:
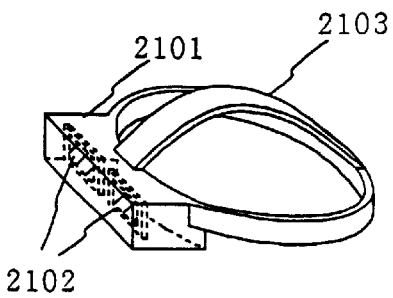

FIG. 7B shows a head mount display which is constituted by a main body 2101, a display device 2102, and a band portion 2103. The display device 2102 is formed of two comparatively compact ones. The present invention can be applied to the display device 2102 and an integrated circuit incorporated into the device.

Figure 7C:
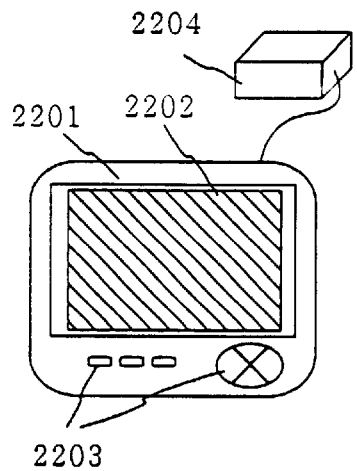

FIG. 7C shows a car navigation unit which is constituted by a main body 2201, a display device 2202, an operation switch 2203, and an antenna 2204. The present invention can be applied to the display device 2202 and an integrated circuit inside the device.

Figure 7D:
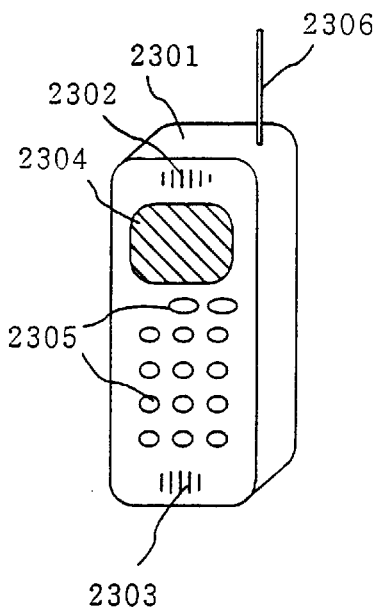

FIG. 7D shows a potable telephone which is constituted by a main body 2301, an audio output portion 2302, an audio input portion 2303, a display device 2304, an operation switch 2305, and an antenna 2306. The present invention can be applied to the display device 2304 and an integrated circuit inside the device.

Figure 7E:
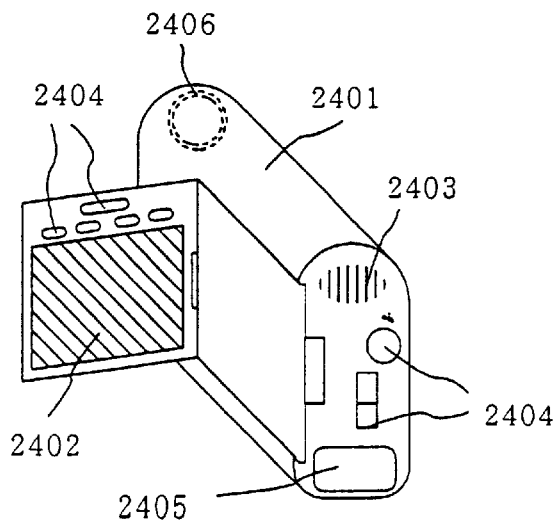

FIG. 7E shows a video camera which is constituted by a main body 2401, a display device 2402, an audio input portion 2403, an operation switch 2404, a battery 2405, and an image receiving portion 2406. The present invention can be applied to the display device 2402 and an integrated circuit inside the device.

Figure 7F:
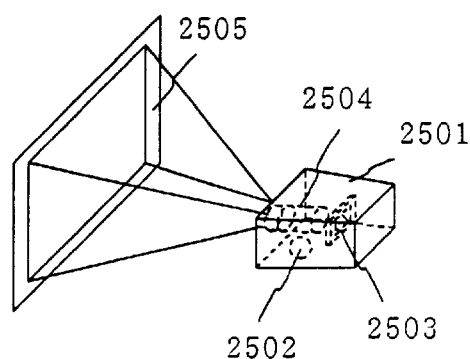

FIG. 7F shows a front projector which is constituted by a main body 2501, a light source 2502, a reflection type display device 2503, an optical system 2504, and a screen 2505. Since the screen 2505 is a large picture screen used for presentation, high resolution is required for the display device 2503. The present invention can be applied to the reflection type display device 2503 and an integrated circuit inside the device.

It should be noted that the term "semiconductor device" used in the present specification implies "a driving device using a semiconductor". The above electro-optical devices and electronic instruments are also included in the category of the semiconductor device.

As described above, by effecting the present invention, the reliability of various semiconductor devices can be improved. Accordingly, the present invention is a useful technique in technology or industry.

If the present invention is effected, it is possible to relieve the phenomenon in which an electric field is locally concentrated in a thin-film transistor formed of a multi-gate structure. That is, it becomes possible to prevent deterioration that tends to occur at a high rate as it comes close to a drain region.

Further, if the amount of current flowing through the vicinity of a center of an active layer is suppressed, it becomes possible to decrease the breakdown or deterioration due to heat.

As described above when the present invention is used, it is possible to prevent the breakdown or deterioration of a semiconductor device (semiconductor element) typified by a thin-film transistor, and to constitute a semiconductor device having high reliability by using such a semiconductor element.

What is claimed is:

1. An active matrix type EL display device comprising:
   a pixel portion over a substrate;
   a driving circuit over the same substrate;
   at least a thin film transistor in the pixel portion, said thin film transistor including:
   a semiconductor island including:
   a source region,
   a drain region, and
   a plurality of channel forming regions each being formed between the source region and the drain region;
   a gate insulating film; and
   a gate electrode being adjacent to the semiconductor island and having the gate insulating film between the semiconductor island and the gate electrode,
   wherein the gate electrode is divided into a plurality of gate electrode portions,
   wherein one of the gate electrode portions being the closest to the drain region has the narrowest width among the plurality of gate electrode portions,
   wherein a current flows from the source region to the drain region through each of the plurality of channel forming regions in a channel length direction.

2. A device according to claim 1,
   wherein the EL display device is used in one selected from the group consisting of a TV camera, a head mount display, a car navigation system, a projector, a video camera, a personal computer.

3. A device according to claim 1, wherein each of the source and drain regions comprises one selected from the group consisting of phosphorus and boron.

4. An active matrix type EL display device comprising:
a pixel portion over a substrate;
a driving circuit portion over the same substrate;
at least a thin film transistor in the pixel portion, said thin film transistor including:
a semiconductor island including:
a source region,
a drain region, and
at least a first channel forming region, a second channel forming region, and a third channel forming region, each being formed between the source region and the drain region;
a gate insulating film; and
a gate electrode, adjacent to the semiconductor island and having the gate insulating film between said semiconductor island and said gate electrode,
wherein the gate electrode is divided into at least a first gate electrode portion, a second gate electrode portion and a third gate electrode portion,
wherein the first gate electrode portion is formed over the first channel forming region and the closest to the drain region, the first channel forming region being the closest to the drain region,
wherein the first gate electrode has the narrowest width so that the first channel forming region has the shortest channel length,
wherein the third gate electrode portion is formed over the third channel forming region and the closest to the source region thereby the third channel forming region being defined the closest to the source region,
wherein the third gate electrode portion has the widest width so that the third channel forming region has the longest channel length,
wherein a current flows from the source region to the drain region through each of the first, second and third channel forming regions in a channel length direction.

5. A device according to claim 4, wherein the semiconductor island comprises crystalline silicon.

6. A device according to claim 4, wherein the gate electrode overlaps with the semiconductor island having the gate insulating film therebetween.

7. A device according to claim 4, wherein the EL display device is used in one selected from the group consisting of a TV camera, a head mount display, a car navigation system, a projector, a video camera, a personal computer.

8. A device according to claim 4,
wherein each of the first, second and third gate electrode portions has two end portions and a middle portion formed between the two end portions, each of the end and middle portions being located in a channel width direction;
wherein the middle portion of each of the first, second and third gate electrodes has the widest width so that a middle portion of each of the first, second and third channel forming regions has the longest channel length.

9. A device according to claim 4, wherein each of the source and drain regions comprises one selected from the group consisting of phosphorus and boron.

10. An active matrix type EL display device comprising:
a pixel portion over a substrate;
a driving circuit portion over the same substrate;
at least a thin film transistor in the pixel portion, said thin film transistor including:
a semiconductor island including:
a source region;
a drain region;
at least a first channel forming region, a second channel forming region and a third channel forming region, each being formed between the source and drain regions;
a gate insulating film;
a gate electrode adjacent to the semiconductor island having the gate insulating film therebetween;
wherein the gate electrode is divided into at least a first gate electrode portion, a second gate electrode portion and a third gate electrode portion;
wherein the first gate electrode portion is formed over the first channel forming region and the closest to the drain region thereby the first channel forming region being defined the closest to the drain region;
wherein the first gate electrode portion has the narrowest width so that the first channel forming region has the shortest channel length;
wherein the third gate electrode portion is formed over the third channel forming region and the closest to the source region thereby the third channel forming region being defined the closest to the source region;
wherein the third gate electrode portion has the widest width so that the third channel forming region has the longest channel length;
wherein each of the first, second and third gate electrode portions has two end portions and a middle portion formed between the two end portions, each of the end and middle portions being located in a channel width direction;
wherein the middle portion of each of the first, second and third gate electrodes has the widest width so that a middle portion of each of the first, second and third channel forming regions has the longest channel length; and
wherein a current flows from the source region to the drain region through each of the first, second, and third channel forming regions in a channel length direction.

11. A device according to claim 10, wherein the semiconductor island comprises crystalline silicon.

12. A device according to claim 10, wherein the gate electrode overlaps with the semiconductor island having the gate insulating film therebetween.

13. A device according to claim 10, wherein the EL display device is used in one selected from the group consisting of a TV camera, a head mount display, a car navigation system, a projector, a video camera, a personal computer.

14. A device according to claim 10, wherein each of the source and drain regions comprises one selected from the group consisting of phosphorus and boron.

* * * * *